United States Patent
Guo et al.

(10) Patent No.: US 11,629,402 B2
(45) Date of Patent: Apr. 18, 2023

(54) ATOMIC LAYER DEPOSITION ON OPTICAL STRUCTURES

(71) Applicant: Applied Materials, Inc., Santa Clara, CA (US)

(72) Inventors: Jinrui Guo, Santa Clara, CA (US); Ludovic Godet, Sunnyvale, CA (US); Rutger Meyer Timmerman Thijssen, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/184,085

(22) Filed: Feb. 24, 2021

(65) Prior Publication Data

US 2021/0180183 A1 Jun. 17, 2021

Related U.S. Application Data

(63) Continuation-in-part of application No. 16/795,232, filed on Feb. 19, 2020.
(Continued)

(51) Int. Cl.
*C23C 16/04* (2006.01)
*C23C 16/30* (2006.01)
(Continued)

(52) U.S. Cl.
CPC ............ *C23C 16/042* (2013.01); *C23C 16/24* (2013.01); *C23C 16/308* (2013.01); *C23C 16/32* (2013.01);
(Continued)

(58) Field of Classification Search
None
See application file for complete search history.

(56) References Cited

U.S. PATENT DOCUMENTS

2006/0183062 A1 8/2006 Dimitrakopoulos et al.
2009/0104790 A1 4/2009 Liang
(Continued)

FOREIGN PATENT DOCUMENTS

JP H06003822 A 1/1994
JP H06053135 A 2/1994
(Continued)

OTHER PUBLICATIONS

Chinese Office Action dated Jan. 28, 2023 for Application No. 202080027992.0.
(Continued)

*Primary Examiner* — Mandy C Louie
(74) *Attorney, Agent, or Firm* — Patterson + Sheridan, LLP

(57) ABSTRACT

Embodiments of the present disclosure generally relate to processing an optical workpiece containing grating structures on a substrate by deposition processes, such as atomic layer deposition (ALD). In one or more embodiments, a method for processing an optical workpiece includes positioning a substrate containing a first layer within a processing chamber, where the first layer contains grating structures separated by trenches formed in the first layer, and each of the grating structures has an initial critical dimension, and depositing a second layer on at least the sidewalls of the grating structures by ALD to produce corrected grating structures separated by the trenches, where each of the corrected grating structures has a corrected critical dimension greater than the initial critical dimension.

20 Claims, 12 Drawing Sheets

Related U.S. Application Data

(60) Provisional application No. 62/865,001, filed on Jun. 21, 2019, provisional application No. 62/834,832, filed on Apr. 16, 2019.

(51) Int. Cl.
  *C23C 16/34* (2006.01)
  *C23C 16/455* (2006.01)
  *C23C 16/40* (2006.01)
  *C23C 16/24* (2006.01)
  *C23C 16/32* (2006.01)

(52) U.S. Cl.
  CPC .......... *C23C 16/345* (2013.01); *C23C 16/401* (2013.01); *C23C 16/405* (2013.01); *C23C 16/45529* (2013.01)

(56) References Cited

U.S. PATENT DOCUMENTS

| | | |
|---|---|---|
| 2010/0143609 A1 | 6/2010 | Fukazawa et al. |
| 2015/0221541 A1 | 8/2015 | Nemani et al. |
| 2015/0279726 A1 | 10/2015 | Ren et al. |
| 2016/0033697 A1* | 2/2016 | Sainiemi ................ G02B 6/34 359/575 |
| 2016/0035539 A1* | 2/2016 | Sainiemi ............. H01J 37/3053 204/298.36 |
| 2016/0300709 A1 | 10/2016 | Posseme et al. |
| 2017/0076968 A1 | 3/2017 | Wang et al. |
| 2017/0084425 A1 | 3/2017 | Uziel et al. |
| 2018/0261516 A1 | 9/2018 | Lin et al. |
| 2018/0261686 A1 | 9/2018 | Lin et al. |
| 2018/0329189 A1 | 11/2018 | Banna et al. |
| 2018/0339314 A1 | 11/2018 | Bhoyar et al. |
| 2018/0351164 A1 | 12/2018 | Hellmich et al. |
| 2018/0358229 A1 | 12/2018 | Koshizawa et al. |
| 2019/0019690 A1 | 1/2019 | Choi et al. |
| 2019/0032194 A2 | 1/2019 | Dieguez-Campo et al. |
| 2019/0079388 A1 | 3/2019 | Fender et al. |
| 2019/0088543 A1 | 3/2019 | Lin et al. |
| 2019/0130731 A1 | 5/2019 | Hassan et al. |
| 2019/0287808 A1 | 9/2019 | Goradia et al. |
| 2019/0311900 A1 | 10/2019 | Pandit et al. |
| 2019/0311909 A1 | 10/2019 | Bajaj et al. |
| 2019/0382879 A1 | 12/2019 | Jindal et al. |
| 2020/0027767 A1 | 1/2020 | Zang et al. |

FOREIGN PATENT DOCUMENTS

| | | |
|---|---|---|
| JP | H07078820 A | 3/1995 |
| JP | 2004152960 A | 5/2004 |
| JP | 2005285972 A | 10/2005 |
| JP | 2009276665 A | 11/2009 |
| JP | 2010532080 A | 9/2010 |
| JP | 2018503710 A | 2/2018 |
| JP | 2018120167 A | 8/2018 |
| KR | 100670375 B1 | 1/2007 |
| KR | 20140118372 A | 10/2014 |
| WO | 2010143283 A1 | 12/2010 |

OTHER PUBLICATIONS

Yong-Sheng Tan, Ze-Bo Fang, "Integrated Circuit Process Experiment" University of Electronic Science and Technology of China Press, (2015), pp. 6-7 and Fig. 2.

Japanese Office Action dated Jan. 24, 2023 for Application No. 2021-560868.

* cited by examiner

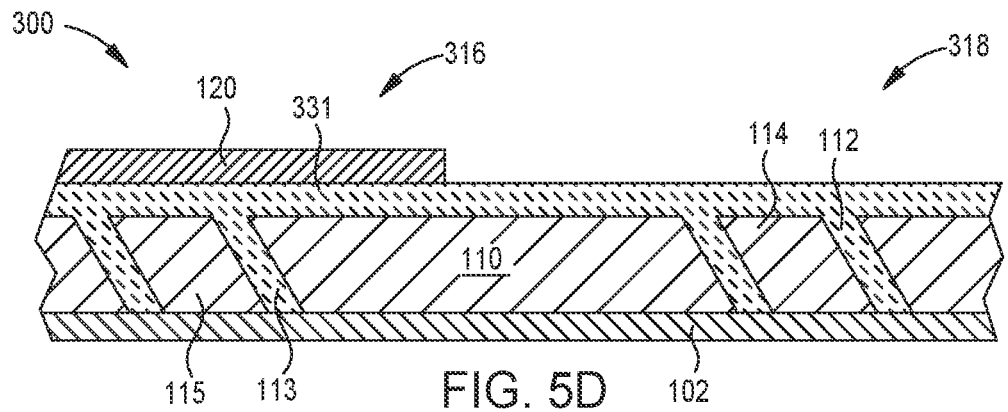
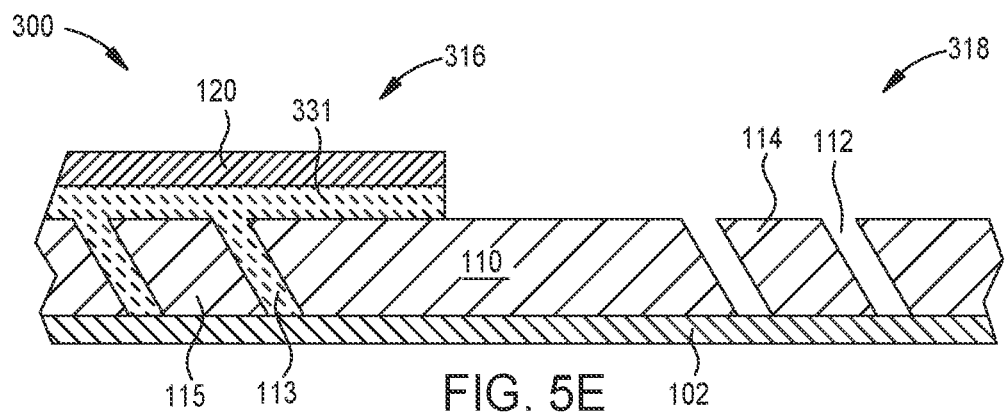
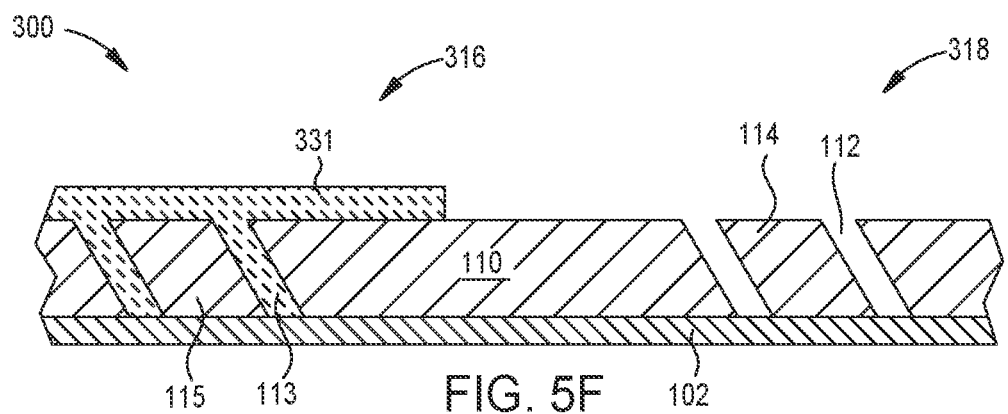

ATOMIC LAYER DEPOSITION ON OPTICAL STRUCTURES

CROSS-REFERENCE TO RELATED APPLICATIONS

This application is a continuation-in-part of U.S. application Ser. No. 16/795,232, filed Feb. 19, 2020, which claims benefit to U.S. Appl. No. 62/865,001, filed on Jun. 21, 2019, and U.S. Appl. No. 62/834,832, filed on Apr. 16, 2019, which are herein incorporated by reference in their entirety.

BACKGROUND

Field

Embodiments of the present disclosure generally relate to a method, and, more specifically, to a method of thin film deposition in trenches.

Description of the Related Art

In optical devices, such as virtual or augmented reality sets, a waveguide combiner is often used to couple a virtual image, transport light inside a glass substrate through total internal reflection, and then couple the image when reaching the position of viewer's eye. For light coupling and decoupling, slanted features and trenches in the waveguide combiner are usually applied as gratings for light diffraction. The orientation of lines (fins) controls the light propagation direction, whereas the tilted angle controls the efficiency of desired orders of diffraction.

Selective deposition in trenches has important industrial applications for optical devices. Precise control of the material properties of the deposited films, such as the refractive index, is necessary to ensure proper functioning of these devices. In addition, film growth without unwanted voids or holes is needed to ensure proper diffraction, reflection, and refraction of incident light on the optical structures. Thus, even film growth is required, along with selectivity, to ensure that the correct portions of the structures receive the films with desired material properties.

Traditional selective deposition processes often include chemical mechanical polishing (CMP) techniques to remove excess film growth and ensure that film growth occurs only in desired portions of the optical workpiece. However, CMP techniques are unable to remove film growth in trenches, as CMP techniques are surface level techniques. Also, the harsh mechanical condition during CMP can damage the underlying structures on the optical workpiece.

Therefore, improved methods for selectively depositing layers on an optical workpiece with grating structures are needed.

SUMMARY

Embodiments of the present disclosure generally relate to processing an optical workpiece containing grating structures on a substrate by deposition processes, such as atomic layer deposition (ALD). In one or more embodiments, a method for processing an optical workpiece includes positioning a substrate containing a first layer within a processing chamber, where the first layer contains grating structures separated by trenches formed in the first layer, and each of the grating structures has an initial critical dimension, and depositing a second layer on at least the sidewalls of the grating structures by ALD to produce corrected grating structures separated by the trenches, where each of the corrected grating structures has a corrected critical dimension greater than the initial critical dimension.

In other embodiments, a method for processing an optical workpiece includes applying a mask on a first layer disposed on a substrate, where the first layer contains grating structures separated by trenches formed in the first layer, the grating structures has a first group of the grating structures having a desired critical dimension and a second group of the grating structures having an initial critical dimension, the desired critical dimension is greater than the initial critical dimension, and the mask covers the first group of the grating structures and leaves exposed or bare the second group of the grating structures. The method also includes positioning the substrate containing the mask disposed on the first layer within a processing chamber, depositing a second layer on the second group of the grating structures by ALD to produce corrected grating structures separated by the trenches, where the corrected grating structures have a corrected critical dimension greater than the initial critical dimension, and removing the mask from the first layer, such that the first group of the grating structures and the corrected grating structures are exposed.

In other embodiments, a method for processing an optical workpiece includes positioning a substrate containing a first layer having a first refractive index within a processing chamber, where the first layer contains grating structures separated by trenches formed in the first layer, and the first layer contains amorphous silicon, silicon nitride, silicon oxide, silicon oxynitride, silicon oxycarbide, titanium oxide, niobium oxide, dopants thereof, or any combination thereof. The method also includes depositing a second layer having a second refractive index by ALD to completely fill the trenches and cover the grating structures, where the second layer contains amorphous silicon, silicon nitride, silicon oxide, silicon oxynitride, titanium oxide, niobium oxide, aluminum oxide, dopants thereof, or any combination thereof, and where a difference between the first refractive index and the second refractive index is about +/−0.001 to about +/−0.1.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 5A-5F depict schematic views of an optical workpiece at different intervals during a process that includes etching with a mask, according to one or more embodiments described and discussed herein.

To facilitate understanding, identical reference numerals have been used, where possible, to designate identical elements that are common to the Figures. It is contemplated that elements and features of one or more embodiments may be beneficially incorporated in other embodiments.

DETAILED DESCRIPTION

Embodiments of the present disclosure generally relate to processing an optical workpiece containing a plurality of features and trenches. The optical workpieces can be or include workpieces, devices, or film stacks used as virtual reality (VR) devices, augmented reality (AR) devices, as well as other devices, including optical devices, display devices, and/or microelectronic devices. A combination of masks, curing, and etches allows for selective deposition on various portions of the optical workpiece. Films are selectively deposited on only certain parts of an optical workpiece, filling some trenches, and not filling others. The embodiments disclosed herein are especially useful for, but not limited to, selectively depositing film material in certain trenches, while preventing deposition in other trenches.

Mask Deposition Followed by Second Layer Deposition

Figure 1A:
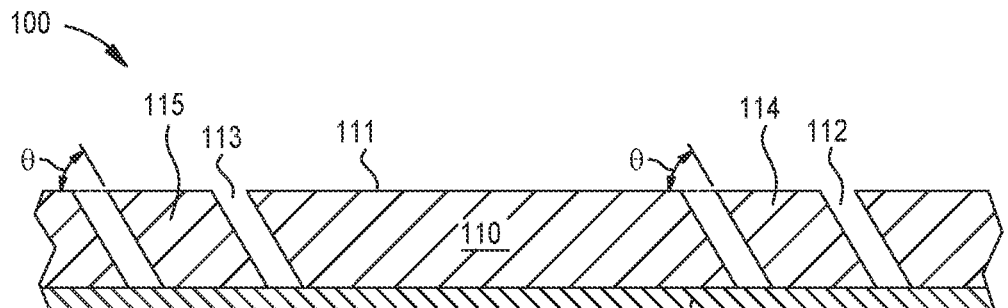
FIGS. 1A-1E depict schematic views of an optical workpiece at different intervals during a process that includes depositing with a mask, according to one or more embodiments described and discussed herein.

FIG. 1A depicts an optical workpiece 100 which includes a first layer 110 disposed on a substrate 102. The first layer 110 can include a plurality of structures 114, 115 formed therein. The plurality of structures 114, 115 can include vertical fins, slanted fins, or pillars (e.g., nanopillars). A plurality of trenches 112, 113 are formed or otherwise defined within the first layer 110 and between the structures 114, 115. The trenches 112, 113 include one or more passageways, vias, spaces, gaps, voids, or holes adjacent any of the structures 114, 115. Each of the trenches 112, 113 can independently be at an angle θ to the surface of the first layer 110, such as from about 15° to about 75°. Each of the trenches 112, 113 can independently have the same or different angle θ of the other spaces. In some embodiments, the angle θ can be from about 15°, about 20°, about 25°, or about 30° to about 45°, about 55°, about 65°, or about 75°.

Each trench 112, 113 can independently have the same or different trench spacing, such as the spacing between adjacent trenches. Each of the trenches 112, 113 can independently have the same or different widths of the other trenches. Each of the trenches 112, 113 can independently have the same or different depths of the other trenches. Each of the trenches 112, 113 can independently have a depth of about 100 nm, about 150 nm, about 200 nm, or about 300 nm to about 400 nm, about 500 nm, about 800 nm, or about 1,000 nm. Each of the trenches 112, 113 can independently have a width of about 50 nm, about 80 nm, about 100 nm, or about 120 nm to about 150 nm, about 200 nm, about 400 nm, or about 600 nm. Each of the trenches 112, 113 can independently have a trench spacing of about 50 nm, about 80 nm, about 100 nm, or about 120 nm to about 150 nm, about 200 nm, about 400 nm, or about 600 nm. Each of the trenches 112, 113 can independently have an aspect ratio (AR) of about 1, about 1.5, about 1.8, or about 2 to about 2.2, about 2.5, about 3, about 3.5, about 4, about 5, or greater.

The optical workpiece 100 has a second plurality of structures 114 and a second plurality of trenches 112 disposed in the second portion 118 of the first layer 110, the structures separated by the trenches. The first plurality of trenches 113 has at least one trench that makes an angle θ of about 15° to about 75° with respect to the top or upper surface 111 of the first layer 110, according to one or more embodiments described and discussed herein. The second plurality of trenches 112 has at least one trench that makes an angle θ of about 15° to about 75° with respect to the surface of the first layer 110, according to one or more embodiments described and discussed herein. The angles θ of the first trench 113 and the second trench 112 can be the same or different from one another.

In some embodiments, the first layer 110 is a surface of the substrate 102, and the substrate 102 can include one or more structures 114, 115. The substrate 102 can include a wafer or panel substrate capable of having material, layers, films, and/or the like deposited thereon. The substrate 102 can include silicon (doped or undoped), crystalline silicon (e.g., Si<100> or Si<111>), strained silicon, silicon oxide, doped or undoped polysilicon, or the like, a germanium substrate, a silicon germanium substrate, a Group III-V compound substrate, such as a gallium arsenide substrate, a gallium nitride substrate, a silicon carbide substrate, a patterned or non-patterned semiconductor-on-insulator (SOI) substrate, a carbon-doped oxide, a silicon nitride, glass, sapphire, quartz, one or more polymeric materials, a solar array, solar panel, a light emitting diode (LED) substrate, or any other materials such as metals, metal alloys, and other conductive materials, or any combination thereof. In some examples, the substrate 102 can be disposed on a substrate holder or a substrate pedestal, a chucking plate, or the like. The substrate 102 can include a plurality of layers or films, such as a semi-insulating material and a semiconducting material, where the semi-insulating material has a higher resistivity than the semiconducting material. The substrate 102 is not limited to any particular size or shape (e.g., round, rectangular, or square), or may have various dimensions. In some examples, the substrate 102 is round and has a diameter of 100 mm, 200 mm, 300 mm, 450 mm, or other diameter substrates.

In other embodiments, the first layer 110 can be or include one or more materials disposed on the substrate 102. The first layer 110 can be or include monocrystalline silicon, polysilicon, amorphous silicon, silicon nitride, silicon oxide, silicon dioxide, silicon oxynitride, silicon oxycarbide, fused silica, one or more metal oxides (e.g., titanium oxide, niobium oxide, aluminum oxide, tantalum oxide), doped derivatives thereof, or any combination thereof. In one or more examples, the first layer 110 can have a refractive index (RI) of about 1.05 to about 4.50. The first layer 110 is deposited or otherwise formed by one or more processes or techniques, such as chemical vapor deposition (CVD), plasma-enhanced CVD (PE-CVD), sub-atmospheric CVD (SA-CVD), high density plasma CVD (HDP-CVD), flowable CVD (FCVD® processes), atomic layer deposition (ALD), furnace ALD, thermal ALD, plasma-enhanced ALD (PE-ALD), physical vapor deposition (PVD), ion beam deposition, spin-coating, or any combination thereof.

In one or more embodiments, the first layer 110 has a thickness of about 40 nm, about 50 nm, about 60 nm, about 80 nm, or about 100 nm to about 120 nm, about 150 nm, about 180 nm, about 200 nm, about 250 nm, about 300 nm, about 350 nm, about 400 nm, about 500 nm, or thicker. For example, the first layer 110 has a thickness of about 40 nm to about 500 nm, about 40 nm to about 300 nm, about 40 nm to about 250 nm, about 40 nm to about 200 nm, about 40 nm to about 180 nm, about 40 nm to about 160 nm, about 40 nm to about 150 nm, about 40 nm to about 120 nm, about 40 nm to about 100 nm, about 40 nm to about 80 nm, about 80 nm to about 500 nm, about 80 nm to about 300 nm, about 80 nm to about 250 nm, about 80 nm to about 200 nm, about 80 nm to about 180 nm, about 80 nm to about 160 nm, about 80 nm to about 150 nm, about 80 nm to about 120 nm, about 80 nm to about 100 nm, about 120 nm to about 500 nm, about 120 nm to about 300 nm, about 120 nm to about 250 nm, about 120 nm to about 200 nm, about 120 nm to about 180 nm, about 120 nm to about 160 nm, or about 120 nm to about 150 nm.

Figure 1B:
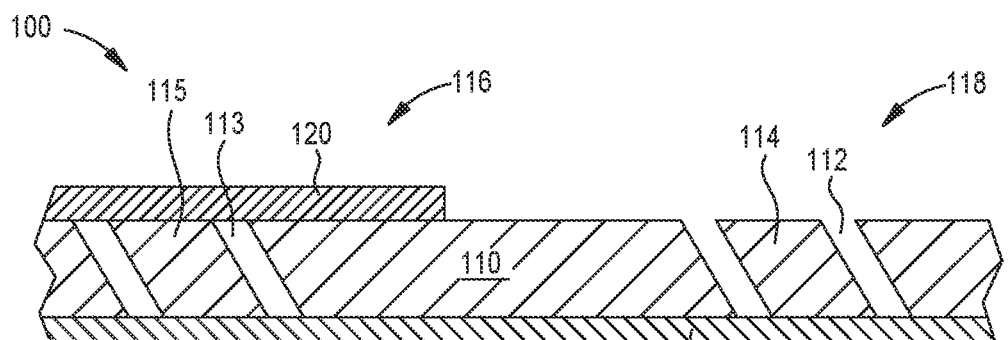
Figure 1C:
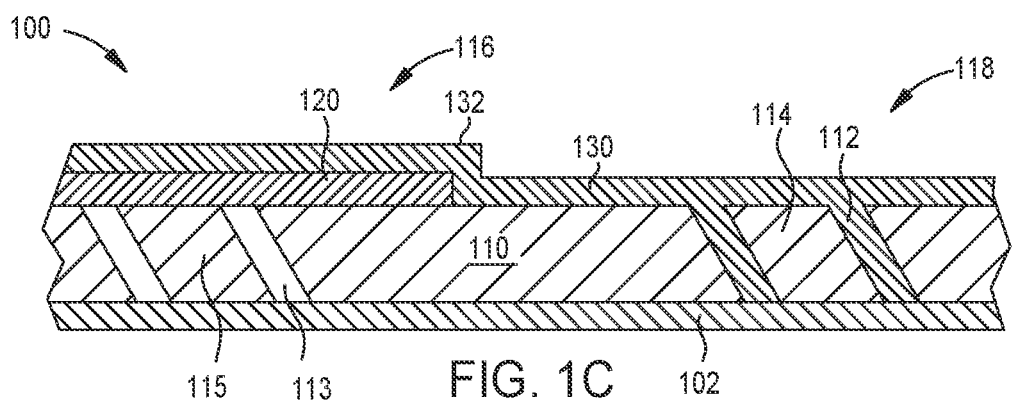
Figure 1D:
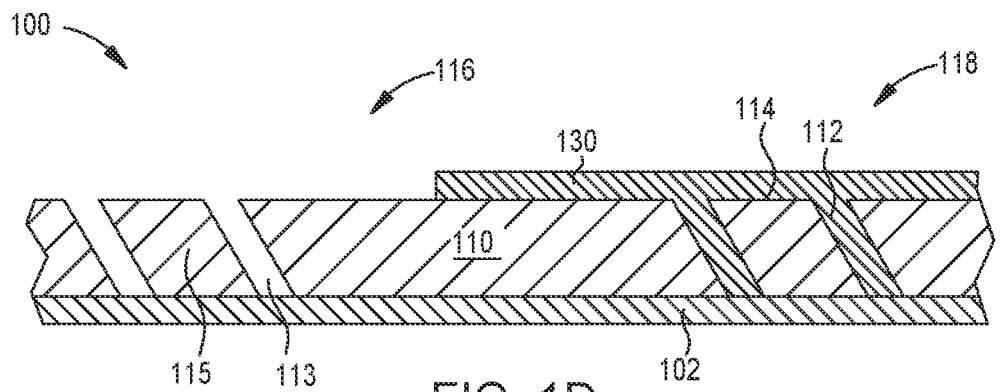
Figure 1E:
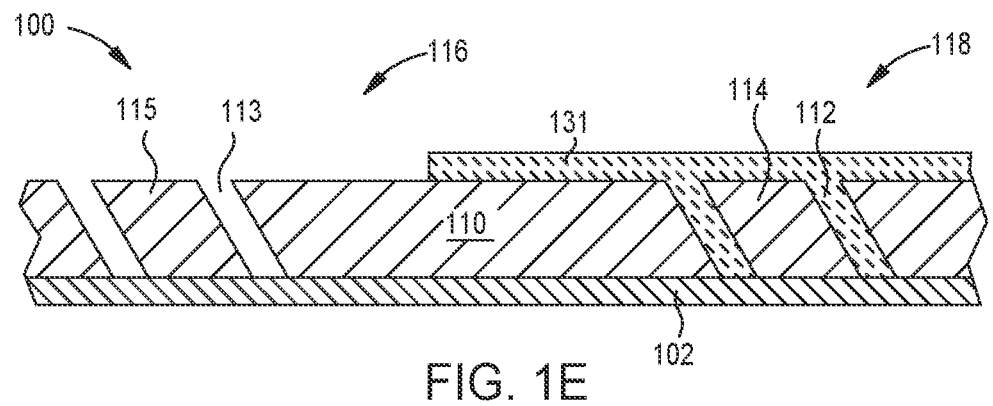
Figure 2:
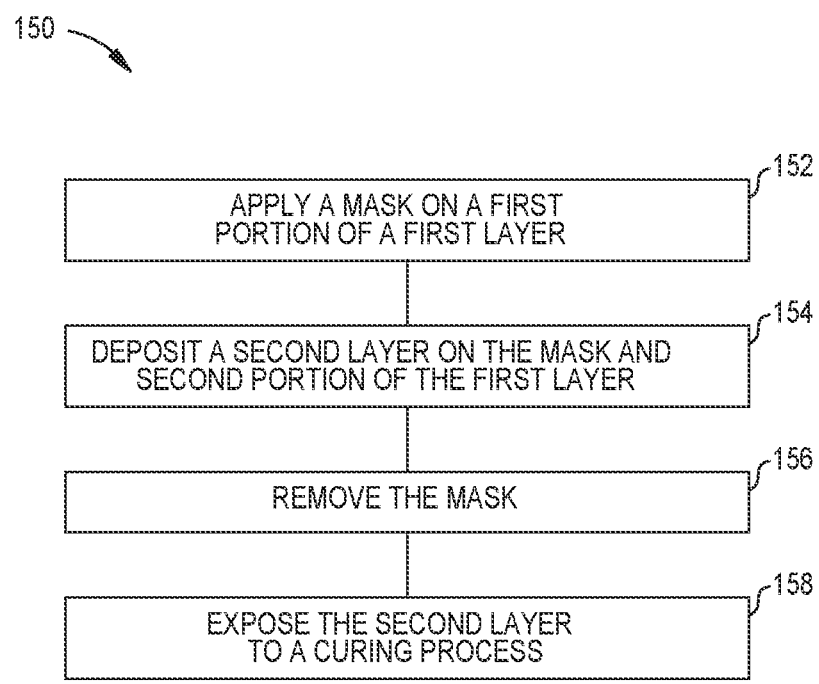
FIG. 2 is a flow diagram of method operations for depositing a second layer on an optical workpiece using a mask, according to one or more embodiments described and discussed herein.

FIG. 2 is a flow diagram of method operations 150 for depositing a second layer 130 on the first layer 110 using a mask 120, according to one or more embodiments described and discussed herein. Although the method 150 operations are described in conjunction with FIGS. 1A-1E and 2, persons skilled in the art will understand that any system configured to perform the method operations, in any order, falls within the scope of the embodiments described herein.

The method 150 begins at operation 152, where a mask 120 is applied, placed, deposited, formed, or otherwise disposed on the first layer 110, as depicted in FIG. 1B. The mask 120 has a predetermined pattern that can be transposed to the underlying layer, such as the first layer 110. The mask 120 covers a first portion 116 of the first layer 110 and leaves exposed a second portion 118 of the first layer. The mask 120 can be or include a contact mask, a proximity mask, a projection mask, or dicing tape. The mask 120 can be separate from the processing chamber, or inside the processing chamber as a movable part. In some examples, the mask 120 can be or include a photo mask in a UV cure process and can be incorporated into a UV chamber or a photolithography tool.

The mask 120 has a thickness from about 10 µm to about 1 mm, such as from about 100 µm to about 500 µm. The thickness of the mask 120 can be designed to reduce the shadowing effect, which can produce non-uniform deposition close to the edge of the mask. For example, the mask 120 has a relatively small thickness, e.g., from about 100 µm to about 150 µm, to reduce the shadowing effect.

At operation 154 of the method 150, a second layer 130 is deposited on the second portion 118 of the first layer 110, as well as the mask 120, as depicted in FIG. 1C. The second layer 130 is at least partially deposited within the second plurality of trenches 112. The mask 120 covers and can substantially or completely protect or shield the first portion 116 of the first layer 110 from the second layer 130 depositing on the first portion 116. In some examples, residual amounts of material of the second layer 130 can eventually contaminate the first portion 116 of the first layer 110. Also, depending on the composition of the second layer 130 and the specific deposition process used to deposit or otherwise form the second layer 130, the mask 120 can include a layer 132 of the same material as the second layer 130 and/or can contain various byproducts, particulates, and/or other contaminants thereon.

The second layer 130 is deposited or otherwise formed by CVD, PE-CVD, SA-CVD, HDP-CVD, flowable CVD (FCVD® processes), ALD, furnace ALD, thermal ALD, PE-ALD, PVD, ion beam deposition, spin-coating, or any combination thereof. The second layer 130 includes a coating material, such as spin-on-carbon, epoxy, naphthalene resin ($C_{10}H_8$), organic planarization layer (OPL), poly(methyl methacrylate) (PMMA), polysilazane, polysiloxane, photoresists, or electron-beam (e-beam) resists. The second layer 130 can also include silicon oxide, silicon dioxide, silicon oxynitride, silicon nitride, silicon carbide, silicon oxycarbide, silicon hydroxynitride (SiOHN), amorphous silicon (a-Si), polysilicon, silicon-containing anti-reflective coating (Si-ARC), aluminum oxide, carbon, alloys thereof, doped derivatives thereof, or any combination thereof. In one or more examples, the second layer 130 can have a refractive index of about 1.05 to about 4.50. The optical and gap fill properties of the second layer 130 can be tuned through polymer type and functional groups. For example, methyl ($CH_3$—) groups or cage-like hydrogen silsesquioxane (HSQ) groups are known to reduce the RI of the second layer 130.

A silicon precursor, such as trisilylamine (TSA) ($N(SiH_3)_3$), silanes, tetrasilane ($Si_4H_{10}$), tetraethyl orthosilicate (TEOS), tetramethoxysilane (TMOS), or octamethylcyclotetrasiloxane (OMCTS), can be used to deposit silicon-containing second layers 130, such as silicon, silicon oxide, or silicon oxynitride, during a CVD process. A silicon precursor, such as trisilylamine (TSA) and a nitrogen precursor, such as ammonia ($NH_3$), can be used to deposit a silicon oxynitride layer during a CVD process. A silicon precursor, such as polysiloxane, can be used to deposit a silicon oxide layer during a spin-on process.

In one or more embodiments, the second layer 130 has a thickness of about 5 nm, about 10 nm, about 15 nm, about 20 nm, about 30 nm, or about 40 nm to about 50 nm, about 60 nm, about 70 nm, about 80 nm, about 90 nm, about 100 nm, or thicker. For example, the second layer 130 has a thickness of about 5 nm to about 100 nm, about 5 nm to about 80 nm, about 5 nm to about 65 nm, about 5 nm to about 50 nm, about 5 nm to about 40 nm, about 5 nm to about 35 nm, about 5 nm to about 30 nm, about 5 nm to about 25 nm, about 5 nm to about 20 nm, about 5 nm to about 15 nm, about 5 nm to about 10 nm, about 10 nm to about 100 nm, about 10 nm to about 80 nm, about 10 nm to about 65 nm, about 10 nm to about 50 nm, about 10 nm to about 40 nm, about 10 nm to about 35 nm, about 10 nm to about 30 nm, about 10 nm to about 25 nm, about 10 nm to about 20 nm, about 10 nm to about 15 nm, about 20 nm to about 100 nm, about 20 nm to about 80 nm, about 20 nm to about 65 nm, about 20 nm to about 50 nm, about 20 nm to about 40 nm, about 20 nm to about 35 nm, about 20 nm to about 30 nm, or about 20 nm to about 25 nm.

The deposition of the second layer 130 can be performed at a substrate temperature or a processing chamber temperature from about 23° C. to about 400° C. For example, a CVD or ALD process can be performed at a substrate temperature or a processing chamber temperature from about 23° C. to about 100° C. A spin coating process can be performed at a substrate temperature or a processing chamber temperature at about 23° C. A wet etch can be performed after deposition of the second layer 130, in order to remove residual deposition of the second layer present under the mask 120.

At operation 156 of the method 150, the mask 120 is removed from the first portion 116 of the first layer 110. Thereafter, the first portion 116 of the first layer 110 is exposed or left bare and the second portion 118 of the first layer 110 contains the second layer 130 deposited thereon, as depicted in FIG. 1D. Various materials (e.g., the layer 132), particulate, or other contaminant contained on the mask 120 can be removed before removing the mask 120 and/or at the same time. The mask 120 and the first portion 116 of the second layer 130 are removed in the same processing step, according to one or more embodiments described and discussed herein. The mask 120 and the first portion 116 of the second layer 130 are sequentially removed in different processing steps, according to one or more embodiments described and discussed herein.

In one or more embodiments, the method 100 can include removing residual material from the first portion 116 of the first layer 110 during an etching process subsequent to removing the mask 120. The etching process can include a wet etch process and includes exposing the residual material to a solution containing hydrofluoric acid (HF), phosphoric acid ($H_3PO_4$), one or more hydroxides (e.g., sodium hydroxide (NaOH), potassium hydroxide (KOH), lithium hydroxide (LiOH), ammonium hydroxide ($NH_4OH$)), or salts thereof. A dilute hydrofluoric acid (DHF) solution having a concentration from about 50:1 to about 1,000:1 (in water) can be used during an etching process, such as for a second layer 130 including silicon oxynitride. The etching process can be a dry etch process and includes exposing the residual material to a plasma containing fluorine (F), chlorine (Cl), compounds thereof, ions thereof, or any combination thereof, such as for a second layer 130 including silicon oxynitride.

At operation 158 of the method 150, the second layer 130 is converted to a cured composition 131, as depicted in FIG. 1E. The curing process drives out unwanted solvents from the second layer 130, solidifies and stabilizes the second layer, and can also modify chemical and optical properties of the second layer, converting the second layer to the cured composition 131. The curing process or treatment can be or include a thermal curing process, an ultraviolet (UV) curing process, a plasma-assisted treatment process, an ion beam treatment process, an electron beam (e-beam) treatment, or any combination thereof, according to some embodiments.

The curing process can be performed at a temperature from about 23° C. to about 400° C. If UV light is applied, the UV wavelength can be a broadband wavelength from about 190 nm to about 500 nm, or single wavelength excimer lasers with wavelengths of about 193 nm, 248 nm, or 365 nm. The UV curing time can vary from about 1 minute to about 10 minutes. The second layer 130 is exposed to ozone ($O_3$) during the curing process, according to one or more embodiments described and discussed herein. In some embodiments, the curing process can include exposing the second layer 130 to one or more processing gases or compounds during the treatment or process, such as argon (Ar), helium (He), oxygen ($O_2$), ozone, hydrogen gas ($H_2$), nitrogen gas ($N_2$), ammonia, water, ethylene ($C_2H_4$), acetylene ($C_2H_2$), or any combination thereof. The curing process is used to modify the second layer 130 film composition and stress as required for a given application. Optical properties of the second layer 130 can be tuned by material design (choice of polymer and functional groups, binder, and solvent), and baking condition (e.g., step-wise baking) to control crosslinking, solvent evaporation, and formation of nanoporosity. In addition, the cured composition 131 is easier or more difficult to remove from the optical workpiece 100 than the unmodified second layer 130.

For example, a second layer 130 including FCVD-deposited silicon hydroxynitride can be cured into a cured composition 131 including silicon oxide. In an additional example, a second layer 130 including a spin coating-deposited polymer and solvent layer can be cured into the cured composition 131 which includes a cross-linked polymer.

In one or more embodiments, the second layer 130 is deposited using FCVD using $TSA/NH_3/O_2$ precursors at a temperature from about 23° C. to about 100° C., the second layer is cured using a baking process at temperatures from about 23° C. to about 400° C. while ozone is applied, and a wet etch including DHF is applied.

In other embodiments, the second layer 130 is deposited using spin coating, the second layer includes an organic planarization layer (OPL) including a polymer including C and H, the second layer is cured using a baking process at temperatures from about 250° C. to about 400° C., and a wet etch including a sulfuric peroxide mix (SPM) is applied.

As described above, a mask is deposited on a first layer. A second layer is deposited on the optical workpiece, but the mask prevents deposition of the second layer in the first plurality of trenches disposed underneath the mask. The mask is removed, and thus the second layer is grown such that material of the second layer is present in the second plurality of trenches, but not the first plurality of trenches.

The mask protects the first plurality of trenches from being filled with the second layer, while still allowing the second plurality of trenches to be filled with the second layer. The method as described above works well for films that do not require curing in order to be removed from the optical workpiece.

Second Layer Deposition Followed by Mask Deposition

Figure 3A:
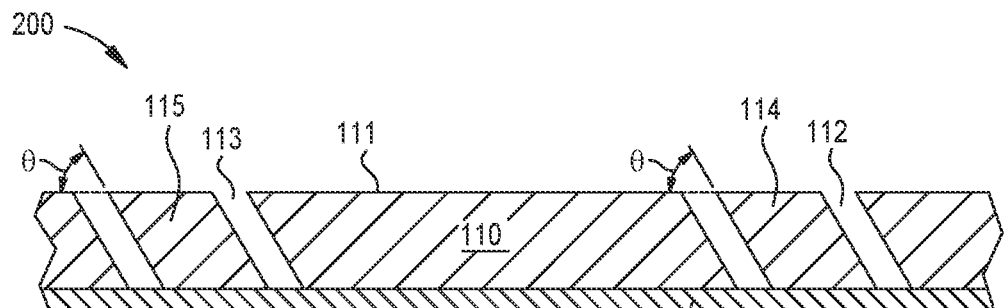
FIGS. 3A-3E depict schematic views of an optical workpiece at different intervals during a process that includes curing with a mask, according to one or more embodiments described and discussed herein.

FIG. 3A depicts an optical workpiece 200, which includes the first layer 110 disposed on the substrate 102 and containing the plurality of trenches 112, 113 and the one or more structures 114, 115 as previously discussed for the optical workpiece 100 in FIG. 1A.

Figure 3B:
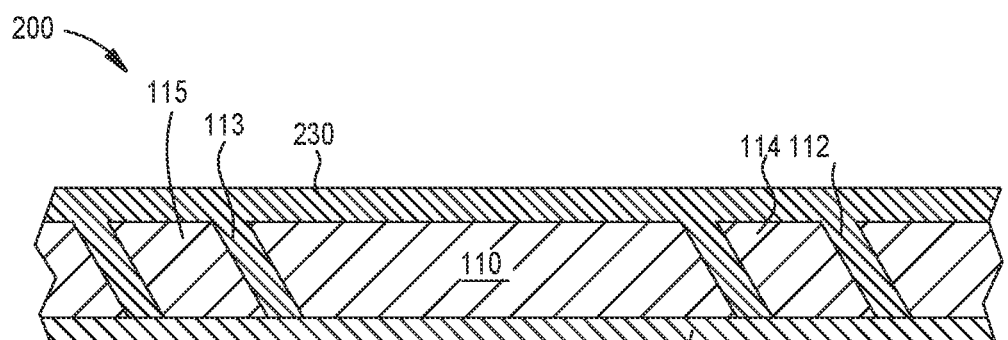
Figure 3C:
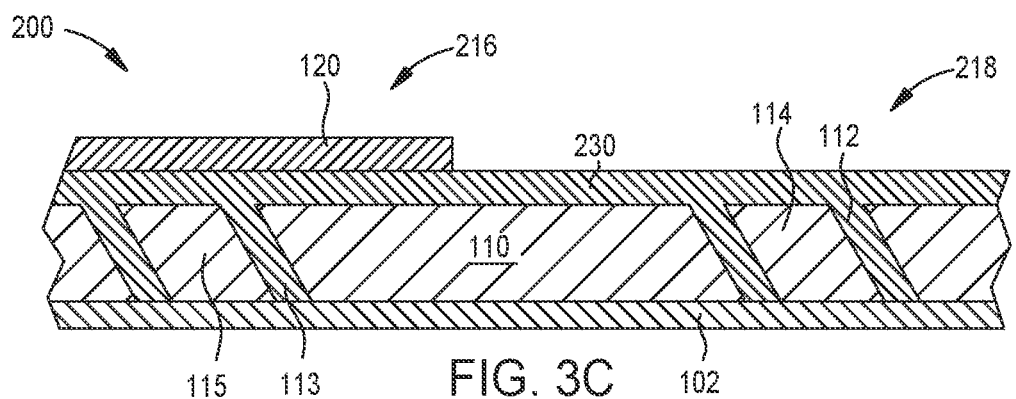
Figure 3D:
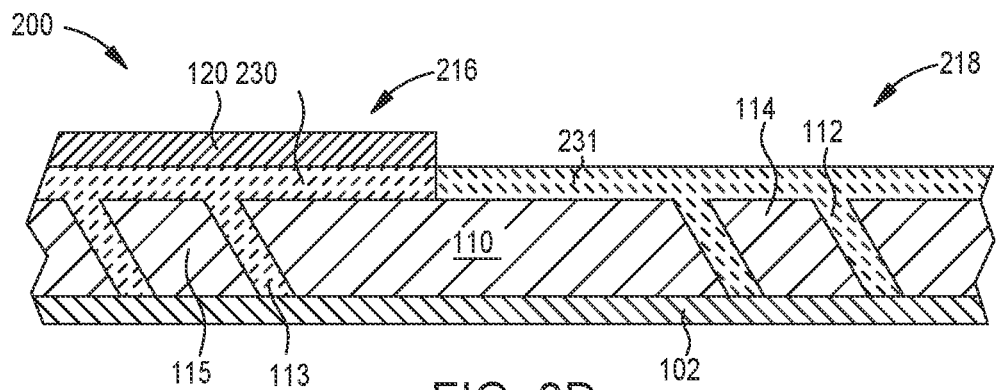
Figure 3E:
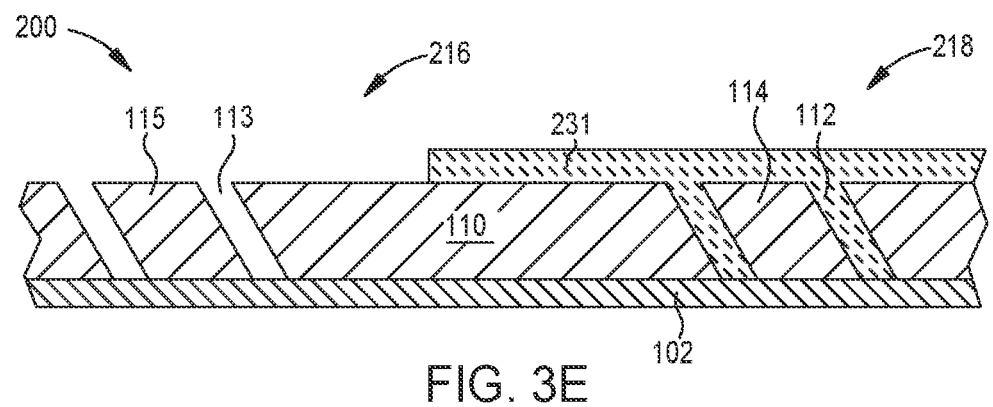
Figure 4:
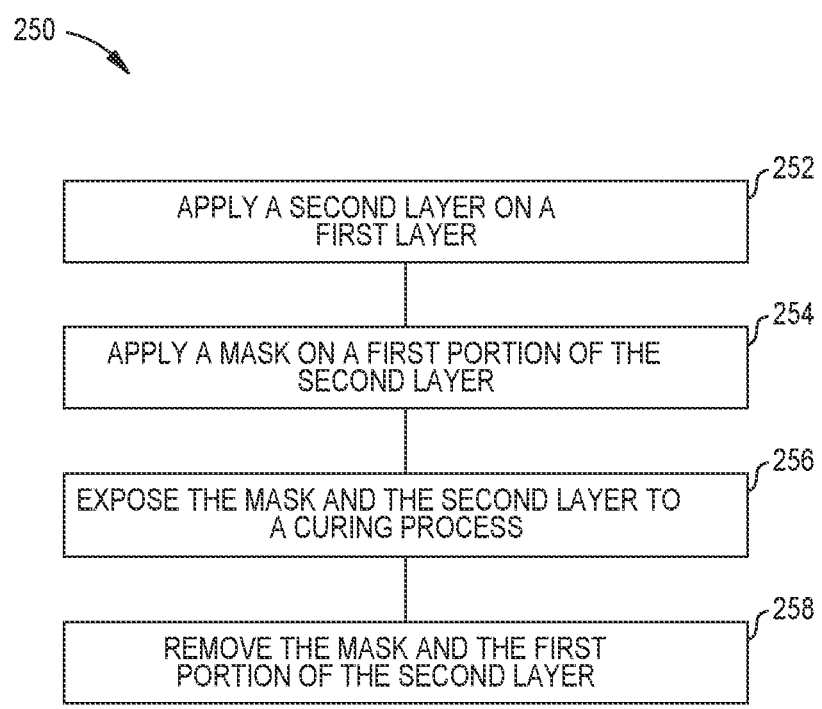
FIG. 4 is a flow diagram of method operations for depositing a second layer on an optical workpiece using a curing process and a mask, according to one or more embodiments described and discussed herein.

FIG. 4 is a flow diagram of method 250 operations for depositing a second layer 230 on the optical workpiece 200, including curing and using a mask 120, according to one or more embodiments described and discussed herein. Although the method 250 operations are described in conjunction with FIGS. 3A-3E and 4, persons skilled in the art will understand that any system configured to perform the method operations, in any order, falls within the scope of the embodiments described herein.

The method 250 begins at operation 252, where a second layer 230 containing an uncured composition is applied, placed, deposited, or otherwise disposed on the first layer 110, as depicted in FIG. 3B. The second layer 230 fills the first plurality of trenches 113 and the second plurality of trenches 112. The second layer 230 also extends along and covers the first layer 110. The second layer 230 is deposited by any of the methods disclosed in the discussion of the deposition of second layer 130 FIG. 1B above. The materials of the second layer 230 are similar to those of the second layer 130 described above. The deposition of the second layer 230 can be performed at a substrate temperature or a processing chamber temperature similar to that of the second layer 130 described above.

At operation 254 of the method 250, the mask 120 is applied, placed, deposited, formed, or otherwise disposed on the second layer 230, as depicted in FIG. 3C. The content of the mask 120 and the application of the mask are similar to those of operation 152 described above.

At operation 256 of the method 250, the optical workpiece 200, including the mask 120 and a second portion 218 of the second layer 230, is exposed to a curing process, as depicted in FIG. 3D. The mask 120 shields or otherwise protects a first portion 216 of the second layer 230 from the curing process while the second portion 218 of the second layer 230 is at least partially cured, substantially cured, or completely cured during the curing process. Subsequent to the curing process, the first portion 216 of the second layer 230 contains the uncured composition. The second portion 218 of the second layer 230 contains a cured composition 231 formed from the uncured composition during the curing process. The curing process is similar to that of the operation 158 described above.

At operation 258 of the method 250, the mask 120 and the first portion 216 of the second layer 230 containing the uncured composition are removed from the optical workpiece 200, as depicted in FIG. 3E. The mask 120 can be removed before removing the first portion 216 of the second layer 230. The mask 120 and the first portion 216 of the second layer 230 can be removed during the same process. The first portion 216 of the layer can be removed by an etching process. The etching process can include a wet etch process and includes exposing the uncured material to a solution containing hydrofluoric acid, phosphoric acid, one or more hydroxides (e.g., sodium hydroxide, potassium hydroxide, lithium hydroxide, ammonium hydroxide), or salts thereof. In one or more examples, a DHF solution having a concentration from about 50:1 to about 1,000:1 (in water) is used during an etching process. The etching process can include a dry etch process and includes exposing the uncured material to plasma containing oxygen, fluorine, chlorine, compounds thereof, ions thereof, or any combination thereof.

In other embodiments, the second layer 330 is deposited using FCVD using TSA/NH$_3$/O$_2$ precursors at a temperature from about 23° C. to about 100° C., the second layer is cured using a baking process at temperatures from about 0° C. to about 400° C. while ultraviolet (UV) light is at a wavelength of about 193 nm to about 500 nm for about 1 minute to about 10 minutes, and a dry or wet etch including DHF is applied.

In other embodiments, the second layer 330 is deposited using FCVD using OMCTS/TMOS/O$_2$ precursors at a temperature from about 23° C. to about 100° C., the second layer is cured using a baking process at temperatures from about 0° C. to about 400° C. while ultraviolet (UV) light is applied at a wavelength of about 193 nm to about 500 nm for about 1 minute to about 10 minutes, and a dry etch including oxygen plasma is performed.

As described above, a second layer is deposited on the first layer, filling both the first plurality of trenches and the second plurality of trenches. A mask is placed over the first portion of the second layer, and the mask protects the first layer from the curing process. The curing process converts the exposed second portion of the second layer into a cured composition. When the mask is removed, the first portion of the second layer is removed along with the mask. The remaining cured composition fills the second plurality of trenches, but the first plurality of trenches is empty.

The mask protects the first plurality of trenches from being cured with the second layer, while still allowing the second plurality of trenches to be filled with the cured second layer. The method as described above works well for films that require curing after deposition.

Second Layer Deposition Followed by Etching Process

Figure 5A:
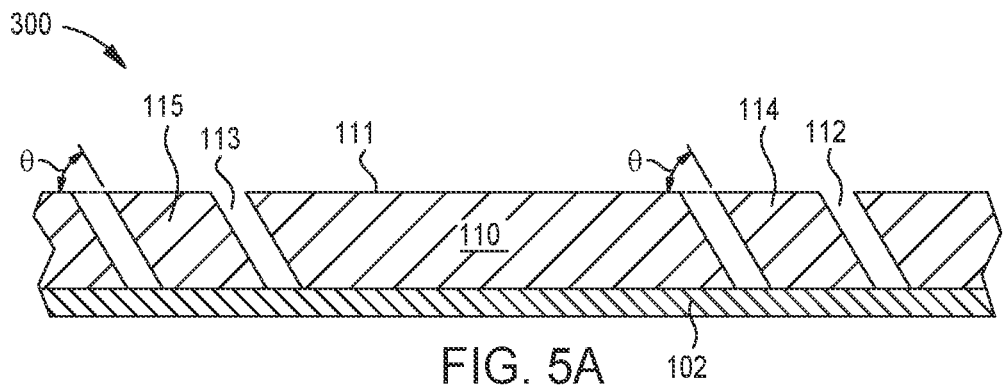

FIG. 5A depicts an optical workpiece 300, which includes a first layer 110 disposed on the substrate 102 and containing the plurality of trenches 112, 113 and the plurality of structures 114, 115 as previously discussed for the optical workpiece 100 in FIG. 1A.

Figure 5B:
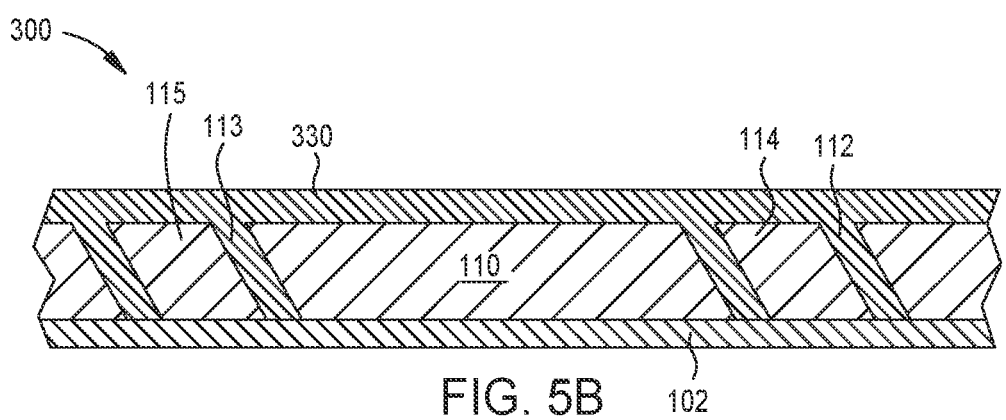
Figure 5C:
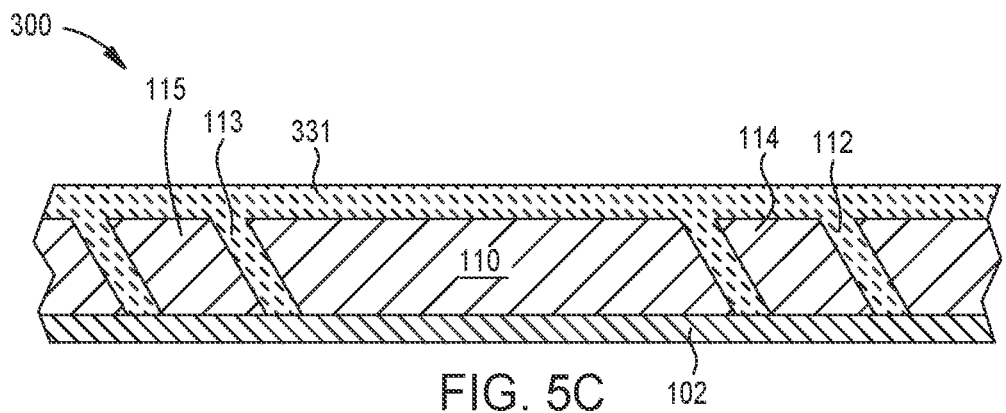
Figure 6:
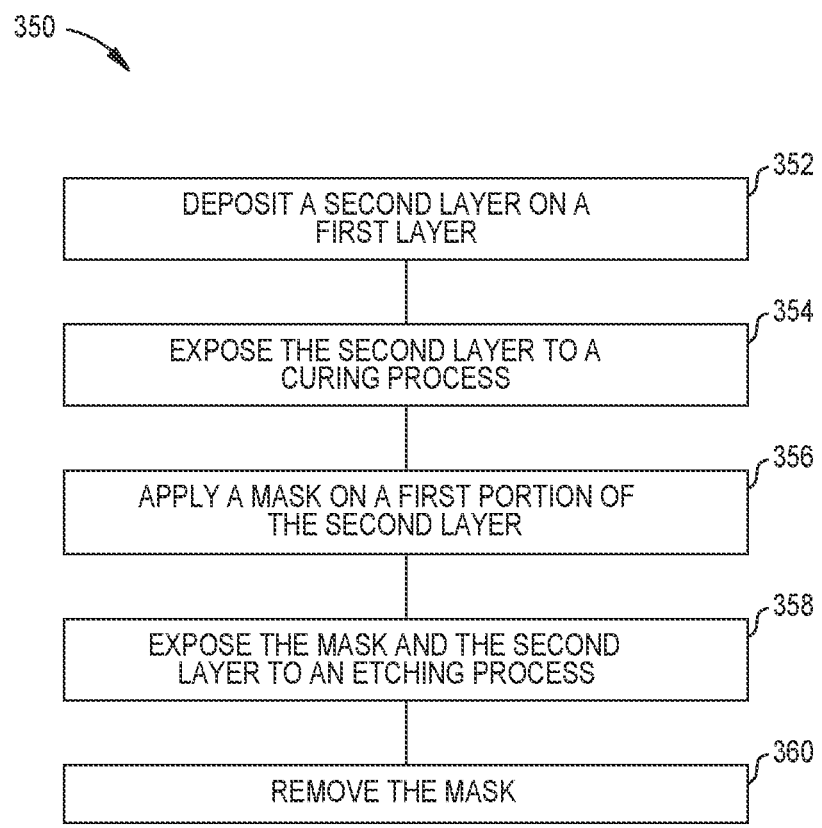
FIG. 6 is a flow diagram of method operations for depositing a second layer on an optical workpiece using a mask and an etching process, according to one or more embodiments described and discussed herein.

FIG. 6 is a flow diagram of method 350 operations for depositing a second layer 330 on the optical workpiece 300, including using the mask 120 and an etching process, according to one or more embodiments described and discussed herein. Although the method 350 operations are described in conjunction with FIGS. 5A-5F and 6, persons skilled in the art will understand that any system configured to perform the method operations, in any order, falls within the scope of the embodiments described herein.

The method 350 begins at operation 352, where a second layer 330 containing an uncured composition is deposited, formed, placed, or otherwise disposed on the first layer 110, as depicted in FIG. 5B. The second layer 330 fills the first plurality of trenches 113 and the second plurality of trenches 112. The second layer 330 also extends along and covers the first layer 110. The second layer 330 is deposited by any of the methods disclosed in the discussion of FIG. 1B above. The materials of the second layer 330 are similar to those of the second layer 130 described above. The deposition of the second layer 330 can be performed at a substrate temperature or a processing chamber temperature similar to that of second layer 130 described above.

At optional operation 354 of the method 350, the second layer 330 is exposed to a curing process, converting the second layer to a modified second layer 331, as depicted in FIG. 5C. The curing process is similar to that described in operation 158 as described above. Although the following operations refer to the modified second layer 331, it is to be understood that the same process can be applied to the second layer 330 as deposited, without the curing process described above.

At operation 356 of the method 350, the mask 120 is applied, placed, deposited, formed, or otherwise disposed on the second layer 330, as depicted in FIG. 5D. The deposition of the mask 120 is similar to that described in operation 152 as described above.

At operation 358 of the method 350, the optical workpiece 300, including the mask 120 and a second portion 318 of the modified second layer 331, is exposed to an etching process, as depicted in FIG. 5E. The mask 120 shields or otherwise protects a first portion 316 of the second layer 330 from the etching process, while the second portion 318 of the modified second layer 331 is at least partially etched away. Subsequent to the etching process, the first portion 316 of the modified second layer 331 is not completely removed. The second portion 318 of the modified second layer 331 is at least partially removed, and the modified second layer is at least partially removed from the second plurality of trenches 112.

The etching process can include a wet etch and/or a dry etch. The wet etch includes exposing the optical workpiece 300 to an etching chemical, which can include DHF, one or more hydroxides (e.g., KOH, NaOH), sulfuric peroxide mix (SPM), phosphoric acid, or any combination of the above. The dry etch includes exposing the optical workpiece 300 to an etching chemical, which can include fluorine-based chemicals, chlorine-based chemicals, oxygen-based chemicals, or any combination of the above. The etch can be performed at temperatures from about 23° C. to about 200° C.

The etching chemistry is based on the composition of the modified second layer 331 to be removed. For example, DHF or hydrofluorocarbons (HFC) can be used to remove the modified second layer 331 including silicon oxide, phosphoric acid ($H_3PO_4$) can be used to remove a modified second layer including silicon nitride, and sulfuric peroxide mix (SPM) or oxygen plasma can be used to remove a modified second layer including carbon.

At operation 360 of the method 350, the mask 120 is removed from the optical workpiece 300, as depicted in FIG. 5F. The mask 120 is removed similarly to the process described in operation 156 above.

In one or more embodiments, the second layer 330 is deposited using spin coating, the second layer includes diazonaphthoquinone (DNQ) and/or novolac, the second layer is cured while ultraviolet (UV) light is applied at a wavelength of about 193 nm to about 500 nm for about 1 minute to about 10 minutes, and a dry etch including oxygen plasma is applied.

In other embodiments, the second layer 330 is deposited using spin coating, the second layer includes polysiloxane or polysilazane, the second layer is cured using a baking process at temperatures from about 0° C. to about 400° C. while ultraviolet (UV) light is applied at a wavelength of about 193 nm to about 500 nm for about 1 minute to about 10 minutes, and a dry or wet etch is performed.

In other embodiments, the second layer 330 is deposited using spin coating, the second layer includes an organic planarization layer (OPL) including a polymer including C and H, the second layer is cured using a baking process at temperatures from about 250° C. to about 400° C., and a dry etch including oxygen plasma is applied.

As described above, a second layer is deposited on the first layer, filling both the first plurality of trenches and the second plurality of trenches. The second layer is exposed to a curing process, converting the second layer to a modified second layer. A mask is placed over the first portion of the second layer. The optical workpiece is exposed to an etching process, which removes the second portion of the modified second layer. Finally, the mask is removed. The remaining cured composition fills the first plurality of trenches, but the second plurality of trenches is empty.

The mask protects the second plurality of trenches from being filled with a cured second layer, while still allowing the first plurality of trenches to be filled with the cured second layer. The method as described above works well for films that require curing to be etched.

Exemplary Atomic Layer Deposition Processes

Figure 7A:
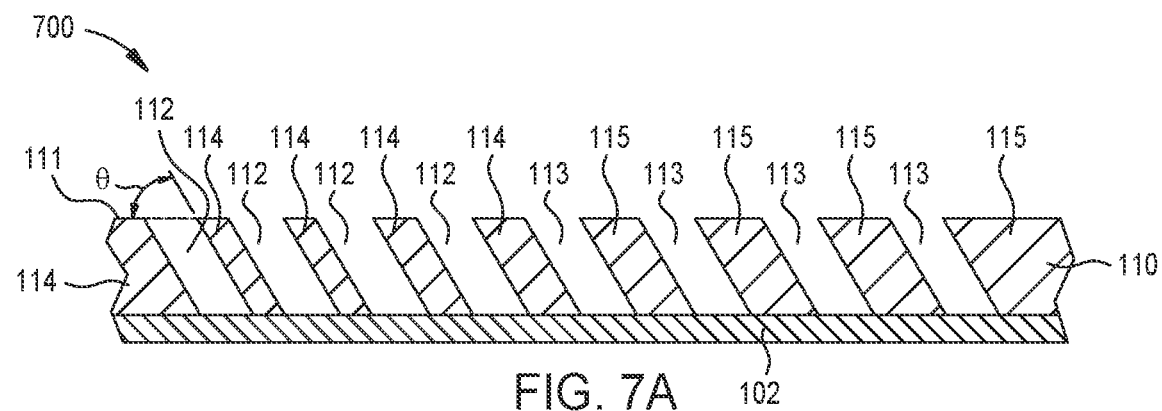
FIGS. 7A-7B depict schematic views of an optical workpiece at different intervals during a process that includes depositing a corrective layer on grating structures, according to one or more embodiments described and discussed herein.
Figure 7B:
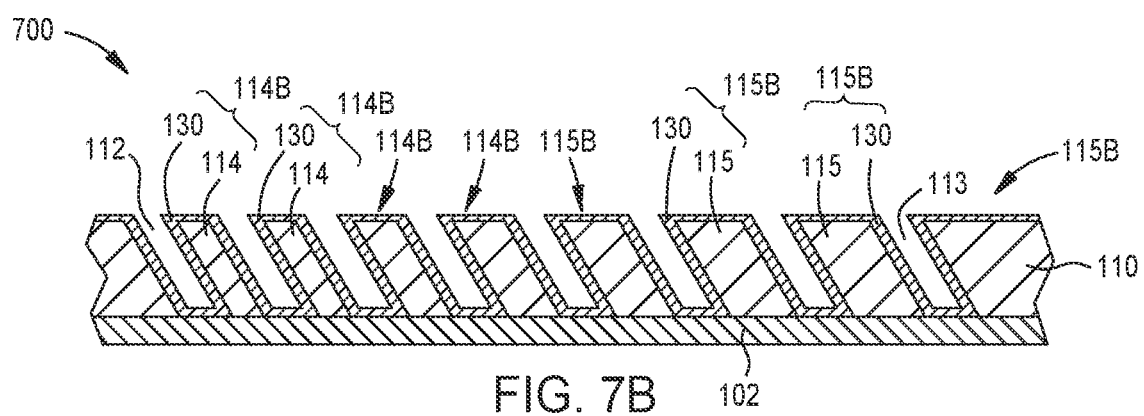

FIGS. 7A-7B depict schematic views of an optical workpiece 700 at different intervals during a process that includes depositing the second layer 130, a corrective layer, by ALD on grating structures 114, 115, according to one or more embodiments described and discussed herein. FIG. 7A depicts the optical workpiece 700 which includes the substrate 102 containing the first layer 110. The method for processing the optical workpiece 700 includes positioning the substrate 102 containing the first layer 110 within a processing chamber, such as an ALD chamber. In some examples, the first layer 110 is or contains amorphous silicon, silicon nitride, silicon oxide, silicon oxynitride, silicon oxycarbide, titanium oxide, niobium oxide, dopants thereof, or any combination thereof.

The first layer 110 contains grating structures 114, 115 separated by the trenches 112, 113 formed in the first layer 110. For example, the grating structures 114 are generally separated by the trenches 112 and the grating structures 115 are generally separated by the trenches 113. As previously discussed above, each of the trenches 112, 113 can be independently positioned at an angle θ of about 15° to about 75° with respect to the top surface 111 of the first layer 110, according to one or more embodiments described and discussed herein. Each of the grating structures 114, 115 independently has an initial critical dimension, measured as the line width or thickness along the top surface 111 of the grating structures 114, 115.

In one or more embodiments, each of the grating structures 114, 115 independently has an average thickness of about 30 nm, about 35 nm, about 40 nm, about 50 nm, about 60 nm, about 75 nm, about 80 nm, about 90 nm, or about 100 nm to about 110 nm, about 120 nm, about 135 nm, about 150 nm, about 180 nm, about 200 nm, about 225 nm, about 250 nm, about 300 nm, about 320 nm, about 335 nm, about 350 nm, or about 380 nm. For example, each of the grating structures 114, 115 independently has an average thickness of about 30 nm to about 350 nm, about 30 nm to about 300 nm, about 30 nm to about 250 nm, about 30 nm to about 200 nm, about 30 nm to about 150 nm, about 30 nm to about 120 nm, about 30 nm to about 100 nm, about 30 nm to about 80 nm, about 60 nm to about 350 nm, about 60 nm to about 300 nm, about 60 nm to about 250 nm, about 60 nm to about 200 nm, about 60 nm to about 150 nm, about 60 nm to about 120 nm, about 60 nm to about 100 nm, about 80 nm to about 350 nm, about 80 nm to about 300 nm, about 80 nm to about 250 nm, about 80 nm to about 200 nm, about 80 nm to about 150 nm, or about 80 nm to about 120 nm.

FIG. 7B depicts the optical workpiece 700 further processed by having the second layer 130 deposited or otherwise disposed on the first layer 110 disposed on the substrate 102. The second layer 130 is deposited by ALD on the first layer 110, such as on top surfaces and the sidewalls of the grating structures 114, 115 and on the bottom surfaces of the trenches 112, 113, which can include portions of the substrate 102 and/or the first layer 110. In some examples, the method includes depositing the second layer 130 by ALD on at least the sidewalls of the grating structures 114, 115 to produce corrected grating structures 114b, 115b separated by the trenches 112, 113. In other examples, the second layer 130 is deposited by ALD on the sidewalls and the top surfaces of the grating structures 114, 115 to produce corrected grating structures 114b, 115b separated by the trenches 112, 113. The corrected grating structures 114b, 115b are the grating structures 114, 115 coated by or otherwise containing the second layer 130.

The second layer 130 is deposited by any type of ALD process including thermal ALD, PE-ALD, or atomic layer epitaxy (ALE). In some examples, the second layer 130 can be or include amorphous silicon, silicon nitride, silicon oxide, silicon oxynitride, titanium oxide, niobium oxide, aluminum oxide, dopants thereof, or any combination thereof. In one or more embodiments, some or all of the aspects of the method 250 (e.g., operation 252) and/or the method 350 (e.g., operation 352) can be applied to the optical workpiece 700 during the ALD processes or other fabrication processes or techniques, as described and discussed herein.

In one or more embodiments, the second layer 130 is deposited by ALD to a thickness of about 5 nm, about 10 nm, about 15 nm, about 20 nm, about 30 nm, or about 40 nm to about 50 nm, about 60 nm, about 70 nm, about 80 nm, about 90 nm, about 100 nm, or thicker. For example, the second layer 130 is deposited by ALD to a thickness of about 5 nm to about 100 nm, about 5 nm to about 80 nm, about 5 nm to about 65 nm, about 5 nm to about 50 nm, about 5 nm to about 40 nm, about 5 nm to about 35 nm, about 5 nm to about 30 nm, about 5 nm to about 25 nm, about 5 nm to about 20 nm, about 5 nm to about 15 nm, about 5 nm to about 10 nm, about 10 nm to about 100 nm, about 10 nm to about 80 nm, about 10 nm to about 65 nm, about 10 nm to about 50 nm, about 10 nm to about 40 nm, about 10 nm to about 35 nm, about 10 nm to about 30 nm, about 10 nm to about 25 nm, about 10 nm to about 20 nm, about 10 nm to about 15 nm, about 20 nm to about 100 nm, about 20 nm to about 80 nm, about 20 nm to about 65 nm, about 20 nm to about 50 nm, about 20 nm to about 40 nm, about 20 nm to about 35 nm, about 20 nm to about 30 nm, or about 20 nm to about 25 nm.

The initial critical dimensions of the grating structures 114, 115 depicted in FIG. 7A are modified by the second layer to produce the corrected grating structures 114b, 115b having a corrected critical dimension, as shown in FIG. 7B. Each of the corrected grating structures 114b, 115b has a corrected critical dimension greater than the initial critical dimension.

Each of the corrected grating structures 114b, 115b independently has an average thickness of about 50 nm, about 60 nm, about 75 nm, about 90 nm, or about 100 nm to about 120 nm, about 135 nm, about 150 nm, about 180 nm, about 200 nm, about 225 nm, about 250 nm, about 300 nm, about 350 nm, or about 400 nm. For example, each of the corrected grating structures 114b, 115b independently has an average thickness of about 50 nm to about 400 nm, about 50 nm to about 300 nm, about 50 nm to about 250 nm, about 50 nm to about 200 nm, about 50 nm to about 150 nm, about 50 nm to about 120 nm, about 50 nm to about 100 nm, about 50 nm to about 80 nm, about 75 nm to about 400 nm, about 75 nm to about 300 nm, about 75 nm to about 250 nm, about 75 nm to about 200 nm, about 75 nm to about 150 nm, about 75 nm to about 120 nm, about 75 nm to about 100 nm, about 100 nm to about 400 nm, about 100 nm to about 300 nm, about 100 nm to about 250 nm, about 100 nm to about 200 nm, about 100 nm to about 150 nm, or about 100 nm to about 120 nm.

The average thickness of the corrected grating structures 114b, 115b, depicted in FIG. 7B, is greater than an average thickness of the initial grating structures 114, 115, depicted in FIG. 7A. In one or more examples, the corrected critical dimension or the average thickness of the corrected grating structures 114b, 115b is about 1%, about 3%, about 5%, about 7%, about 10%, about 12%, about 15%, about 18%, about 20%, about 22%, about 25%, about 30%, about 35%, about 40%, or about 50% to about 60%, about 65%, about 80%, about 100%, about 120%, about 150%, about 180%, about 200%, or about 250% greater than the initial critical dimension or an average thickness of the initial grating structures 114, 115. For example, the corrected critical dimension or the average thickness of the corrected grating structures 114b, 115b is about 10% to about 250%, about 10% to about 200%, about 10% to about 150%, about 10% to about 120%, about 10% to about 100%, about 10% to about 80%, about 10% to about 50%, about 50% to about 250%, about 50% to about 200%, about 50% to about 150%, about 50% to about 120%, about 50% to about 100%, about 50% to about 80%, about 100% to about 250%, about 100% to about 200%, about 100% to about 150%, or about 100% to about 120% greater than the initial critical dimension or an average thickness of the initial grating structures 114, 115.

In other examples, the corrected critical dimension or the average thickness of the corrected grating structures 114b, 115b is about 5% to about 80%, about 5% to about 65%, about 5% to about 50%, about 5% to about 40%, about 5% to about 30%, about 5% to about 25%, about 5% to about 20%, about 5% to about 18%, about 5% to about 15%, about 5% to about 10%, about 5% to about 8%, about 10% to about 80%, about 10% to about 65%, about 10% to about 50%, about 10% to about 40%, about 10% to about 30%, about 10% to about 25%, about 10% to about 20%, about 10% to about 18%, about 10% to about 15%, about 10% to about 12%, about 20% to about 80%, about 20% to about 65%, about 20% to about 50%, about 20% to about 40%, about 20% to about 30%, about 20% to about 25%, or about 20% to about 22% greater than the initial critical dimension or an average thickness of the initial grating structures 114, 115.

In one or more examples, the initial critical dimension or average thickness of the grating structures 114, 115 is about 50 nm, the second layer 130 is deposited by ALD to a thickness of about 10 nm, so that the corrected critical dimension or average thickness of the corrected grating structures 114b, 115b is increased by about 20% to about 60 nm. In other examples, the initial critical dimension or average thickness of the grating structures 114, 115 is about 250 nm, the second layer 130 is deposited by ALD to a thickness of about 50 nm, so that the corrected critical dimension or average thickness of the corrected grating structures 114b, 115b is increased by about 20% to about 300 nm. In some examples, the initial critical dimension or average thickness of the grating structures 114, 115 is about 300 nm, the second layer 130 is deposited by ALD to a thickness of about 20 nm, so that the corrected critical dimension or average thickness of the corrected grating structures 114b, 115b is increased by about 7% to about 320 nm.

In one or more embodiments, the second layer 130 has the same or substantially the same refractive index as the first layer 110. The first layer 110 has a first refractive index, the second layer 130 has a second refractive index, and the first and second refractive indexes are the same or substantially the same. The difference between the first refractive index and the second refractive index can be about +/−0.001 to about +/−0.1, about +/−0.001 to about +/−0.01, or about +/−0.01 to about +/−0.1.

In other embodiments, the second layer 130 has a substantially different refractive index compared to the refractive index of the first layer 110. The second layer can be used to adjust or shift the refractive index if desired. In such embodiments, the difference between the first refractive index and the second refractive index can be about +/−0.1 to about +/−3, +/−0.1 to about +/−2, +/−0.1 to about +/−1, +/−0.5 to about +/−3, +/−0.5 to about +/−2, +/−0.5 to about +/−1, +/−1 to about +/−3, +/−1 to about +/−2, or +/−1 to about +/−2.5.

Each of the refractive index of the first layer 110 (e.g., first RI) and the refractive index of the second layer 130 (e.g., second RI) can independently be about 1.05, about 1.1, about 1.2, about 1.5, about 1.6, about 1.8, or about 2 to about 2.2, about 2.5, about 2.8, about 3, about 3.2, about 3.5, about 3.8, about 4, about 4.2, or about 4.5. For example, each of the refractive index of the first layer 110 and the refractive index of the second layer 130 can independently be about 1.05 to about 4.5, about 1.05 to about 4, about 1.05 to about 3.5, about 1.05 to about 3, about 1.05 to about 2.5, about 1.05 to about 2, about 1.05 to about 1.5, about 1.05 to about 1.3, about 1.5 to about 4.5, about 1.5 to about 4, about 1.5 to about 3.5, about 1.5 to about 3, about 1.5 to about 2.5, about 1.5 to about 2, about 1.5 to about 1.8, about 2 to about 4.5, about 2 to about 4, about 2 to about 3.5, about 2 to about 3, about 2 to about 2.5, or about 2 to about 2.2.

FIGS. 8A-8D depict schematic views of an optical workpiece 800 at different intervals while being processed, according to one or more embodiments described and discussed herein. The process generally includes depositing with a mask 120 on a first portion of the first layer 110 and leaving exposed a second portion of the first layer 110, selectively depositing by ALD the second layer 130 (e.g., a corrective layer) on the grating structures within the second portion of the first layer 110, and removing the mask 120. In one or more embodiments, some or all of the aspects of the method 150 (e.g., operations 152, 154, 156) can be applied to the optical workpiece 800 during the ALD processes or other fabrication processes or techniques, as described and discussed herein.

Figure 8A:
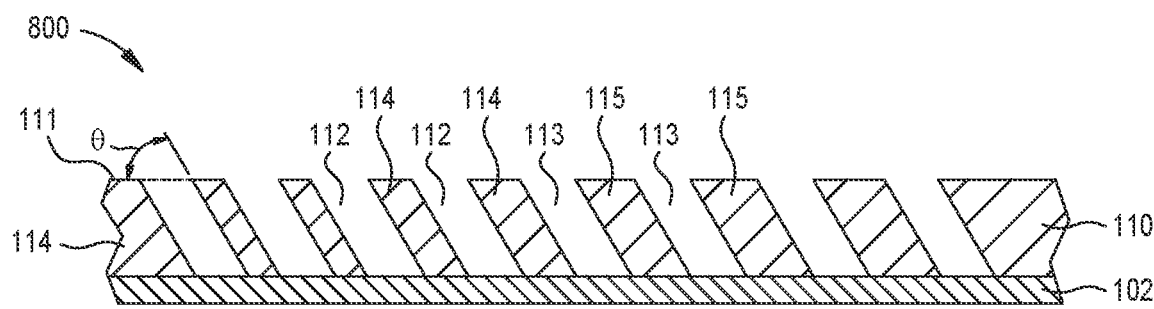
FIGS. 8A-8D depict schematic views of an optical workpiece at different intervals during a process that includes depositing with a mask and depositing a corrective layer on grating structures, according to one or more embodiments described and discussed herein.

FIG. 8A depicts the optical workpiece 800 which includes the substrate 102 containing the first layer 110. In some examples, the first layer 110 is or contains amorphous silicon, silicon nitride, silicon oxide, silicon oxynitride, silicon oxycarbide, titanium oxide, niobium oxide, dopants thereof, or any combination thereof. The first layer 110 contains the grating structures 114 generally separated by the trenches 112 and the grating structures 115 generally separated by the trenches 113. As previously discussed above, each of the trenches 112, 113 can be independently positioned at an angle θ of about 15° to about 75° with respect to the top surface 111 of the first layer 110, according to one or more embodiments described and discussed herein. In one or more examples, the grating structures 114, 115 contain a first group of the grating structures 115 having a desired critical dimension and a second group of the grating structures 114 having an initial critical dimension. The desired critical dimension of the grating structures 115 is greater than the initial critical dimension of the grating structures 114.

Figure 8B:
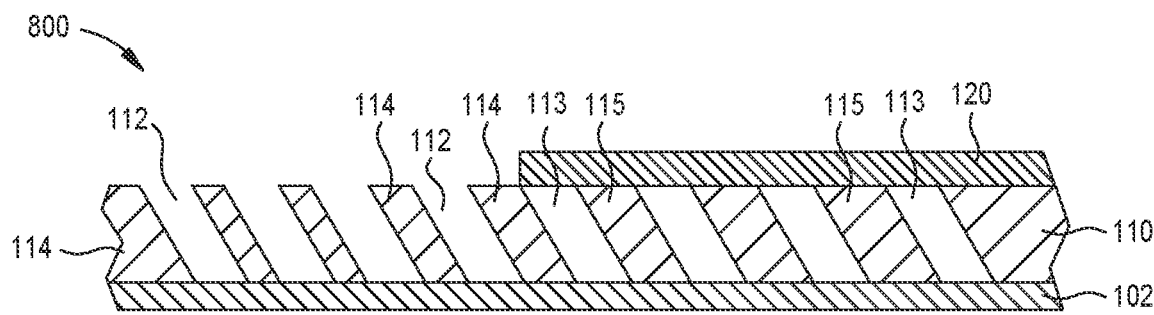

FIG. 8B depicts the mask 120 disposed on at least a portion of the first layer 110. The mask 120 can be applied, deposited, or otherwise formed on the first layer 110, such that the mask 120 covers the first group of the grating structures 115 and leaves exposed or bare the second group of the grating structures 114.

Figure 8C:
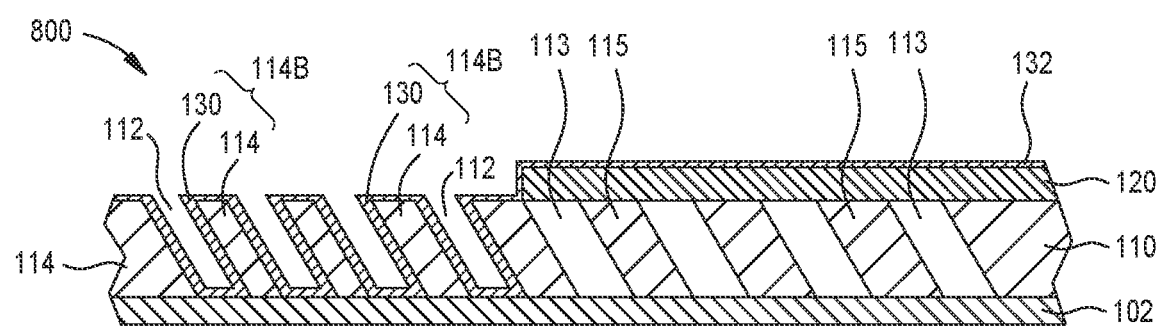

FIG. 8C depicts the second layer 130 deposited on the trenches 112 and the second group of the grating structures 114 by ALD to produce corrected grating structures 114b separated by the trenches 112. The corrected grating structures 114b have a corrected critical dimension greater than the initial critical dimension due to the addition of the second layer 130. The trenches 113 and the second group of the grating structures 115 stay exposed, bare, or otherwise free of the second layer 130. The mask 120 can include a layer 132 of the same material as the second layer 130 and/or can contain various byproducts, particulates, and/or other contaminants thereon.

Figure 8D:
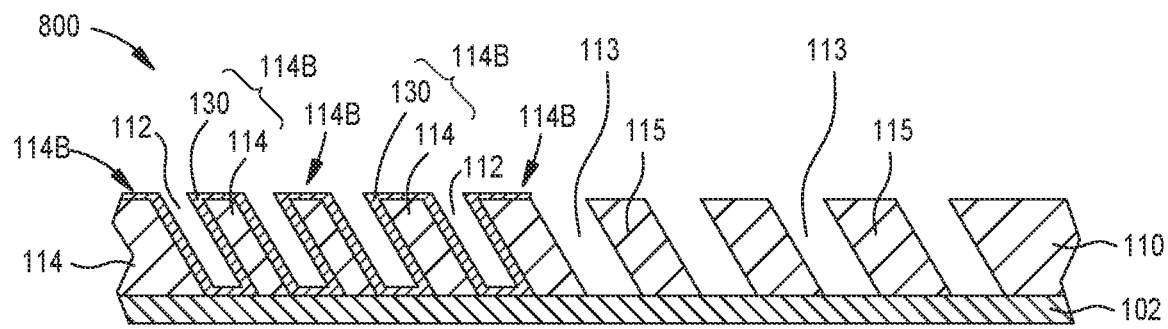

FIG. 8D depicts the optical workpiece 900 after the mask 120 and the layer 132 have been removed from the first layer 110. The trenches 113 and the second group of the grating structures 115 stay exposed, bare, or otherwise free of the mask 120.

The corrected grating structures 114b and the grating structures 115 can have the same or substantially the same critical dimension. In one or more embodiments, the corrected critical dimension of the corrected grating structures 114b is about +/−10% of the desired critical dimension of the first group of the grating structures 115. For example, the corrected critical dimension of the corrected grating structures 114b can be about +/−8%, about +/−5%, about +/−3%, about +/−2%, about +/−1%, about +/−0.5%, or about +/−0.1% of the desired critical dimension of the first group of the grating structures 115.

Figure 9A:
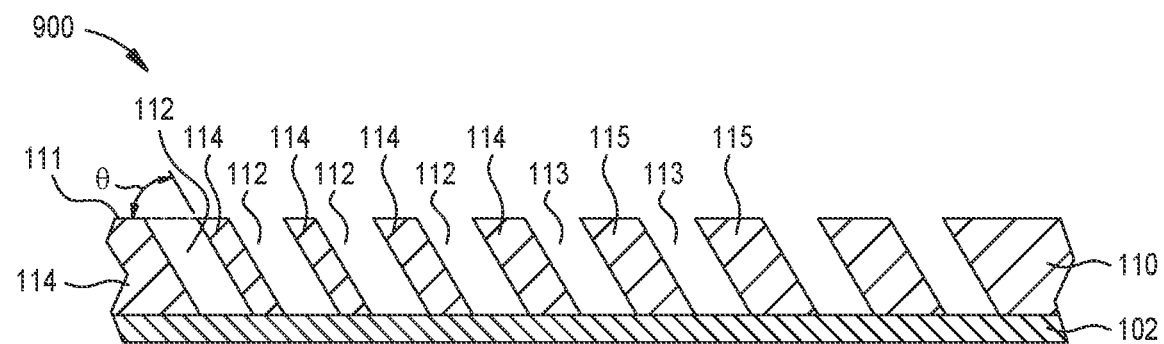
FIGS. 9A-9B depict schematic views of an optical workpiece at different intervals during a process that includes depositing a gap-fill layer between the grating structures, according to one or more embodiments described and discussed herein.
Figure 9B:
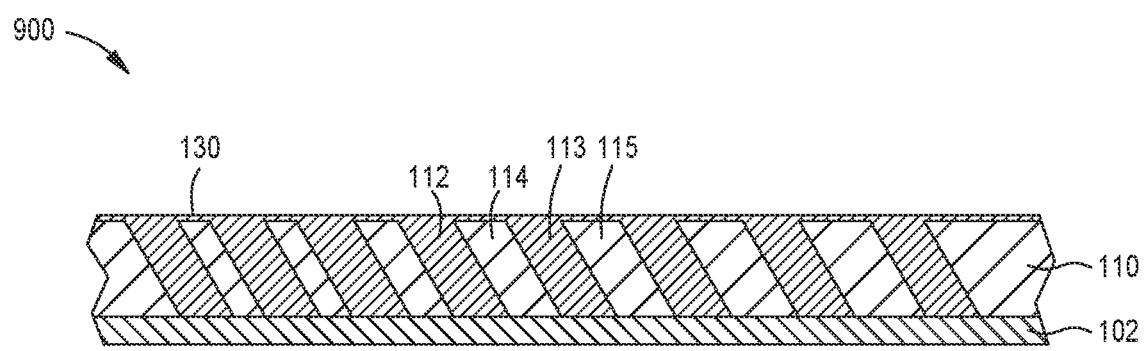

FIGS. 9A-9B depict schematic views of an optical workpiece 900 at different intervals while being processed that includes depositing by ALD the second layer 130 as a gap-fill layer between the grating structures 114, 115, according to one or more embodiments described and discussed herein. FIG. 9A depicts the optical workpiece 900 which includes the substrate 102 containing the first layer 110. In some examples, the first layer 110 is or contains amorphous silicon, silicon nitride, silicon oxide, silicon oxynitride, silicon oxycarbide, titanium oxide, niobium oxide, dopants thereof, or any combination thereof. The first layer 110 contains the grating structures 114 generally separated by the trenches 112 and the grating structures 115 generally separated by the trenches 113. As previously discussed above, each of the trenches 112, 113 can be independently positioned at an angle θ of about 15° to about 75° with respect to the top surface 111 of the first layer 110, according to one or more embodiments described and discussed herein.

The method for processing the optical workpiece 900 includes positioning the substrate 102 containing the first layer 110 within a processing chamber, such as an ALD chamber. FIG. 9B depicts the optical workpiece 900 further processed by having the second layer 130 deposited or otherwise disposed on the first layer 110 disposed on the substrate 102. The second layer 130 is deposited by ALD on the first layer 110, such as on top surfaces and the sidewalls of the grating structures 114, 115 and on the bottom surfaces of the trenches 112, 113, which can include portions of the substrate 102 and/or the first layer 110. The second layer 130 is deposited by ALD to fill the trenches 112, 113 while coating or otherwise depositing on the sidewalls and top surfaces of the grating structures 114, 115. In one or more embodiments, some or all of the aspects of the method 250 (e.g., operation 252) and/or the method 350 (e.g., operation 352) can be applied to the optical workpiece 900 during the ALD processes or other fabrication processes or techniques, as described and discussed herein.

In some embodiments, the first layer 110 and the second layer 130 have the same or substantially the same refractive indexes. For example, the difference between the refractive index of the first layer 110 and the refractive index of the second layer 130 can be about +/−0.001 to about +/−0.1, about +/−0.001 to about +/−0.01, or about +/−0.01 to about +/−0.1. In one or more examples, the first layer 110 contains amorphous silicon, silicon nitride, silicon oxide, silicon oxynitride, silicon oxycarbide, titanium oxide, niobium oxide, dopants thereof, or any combination thereof and the second layer 130 contains amorphous silicon, silicon nitride, silicon oxide, silicon oxynitride, titanium oxide, niobium oxide, aluminum oxide, dopants thereof, or any combination thereof.

In one or more embodiments, the processes 150, 250, and/or 350, and/or any processes, operations, or portions thereof described and discussed herein, can be performed in a CVD chamber, such as a thermal CVD chamber, a PE-CVD chamber, a high-density plasma CVD chamber, a low pressure CVD chamber, a reduced pressure CVD chamber, or an atmospheric pressure CVD chamber. In other embodiments, the processes 150, 250, and/or 350, and/or any processes, operations, or portions thereof described and discussed herein, can be performed in a PVD chamber, an ALD chamber, a PE-ALD chamber, an etch chamber (thermal or plasma), an epitaxy chamber, an anneal chamber, or any other processing chamber in which temperature monitoring might be useful. Examples of the processing chamber can include CVD chambers such as AKT® PECVD chambers, PRODUCER™ chambers, Eterna FCVD® chambers, and PRECISION 5000® chambers, commercially available from Applied Materials Inc., Santa Clara, Calif.

In other embodiments, the surfaces of the optical workpieces 100, 200, 300, 700, 800, 900 are exposed to a dry-clean treatment to remove oxides, carbons, particulates, and/or other contaminants during the processes 150, 250, and/or 350, and/or any processes, operations, or portions thereof described and discussed herein. Any suitable dry-clean treatment process that removes oxides from the substrate without significantly damaging the optical workpieces 100, 200, 300, 700, 800, 900 can be used. Suitable dry-clean treatment processes include sputter etch processes, plasma-based oxide etch processes, or combinations thereof. The dry-clean treatment can include exposing the optical workpieces 100, 200, 300, 700, 800, 900 to an etchant and to plasma, ions, radicals, or a combination thereof. The etchant can be or include one or more of oxygen, fluorine, chlorine, nitrogen, plasmas thereof, ions thereof, radicals thereof, or any combination thereof. The dry-clean treatment includes exposing the optical workpieces 100, 200, 300, 700, 800, 900 to a fluorine plasma generated from a combination of nitrogen trifluoride ($NF_3$) and ammonia ($NH_3$). Other contemplated etch processes include $NF_3/NH_3$ inductively coupled plasma processes or $NF_3/NH_3$ capacitively coupled plasma processes.

In one or more embodiments, the dry-clean treatment is a plasma-based oxide etch process that is a remote plasma assisted dry etch process which involves the simultaneous exposure of a substrate to $NF_3$ and $NH_3$ plasma by-products. In some examples, the plasma-based oxide etch process can include a SICONI® etch process that is commercially available from Applied Materials, Inc. of Santa Clara, Calif. The SICONI® etch process can be performed in a SICONI® Preclean chamber, commercially available from Applied Materials, Inc. of Santa Clara, Calif.

In some examples that use remote plasma, excitation of the gas species allows plasma-damage-free substrate processing. The remote plasma etch can be largely conformal and selective towards silicon oxide layers, and thus does not readily etch silicon regardless of whether the silicon is amorphous, crystalline or polycrystalline. The remote plasma process will generally produce solid by-products which grow on the surface of the optical workpieces 100, 200, 300, 700, 800, 900 as material is removed. The solid by-products can be subsequently removed via sublimation when the temperature of the optical workpieces 100, 200, 300, 700, 800, 900 is raised (e.g., to about 300° C.). The plasma etch process results in the removal of oxides, particulate, and other contaminants from the surface of the optical workpieces 100, 200, 300, 700, 800, 900.

In some examples, the dry-clean treatment process can be performed or conducted in a processing chamber fluidly coupled to a remote plasma source (RPS) while treating the optical workpieces 100, 200, 300, 700, 800, 900. For example, the processing chamber can be an AKTIV Pre-Clean® chamber, commercially available from Applied Materials, Inc. of Santa Clara, Calif. In other examples, the dry-clean treatment process can be performed in an etch chamber using an inductively coupled plasma (ICP) source. For example, the etch chamber can be a Centura® Advantedge® Mesa® Etch chamber, commercially available from Applied Materials, Inc. of Santa Clara, Calif. Alternatively, the cleaning process can be performed in an etch chamber employing a radical-based chemistry. The optical workpieces 100, 200, 300, 700, 800, 900 is exposed to the etchant during the dry-clean treatment to remove the contaminants for a period of about 20 minutes or less, for example, about 10 minutes.

In one or more embodiments, optical workpieces, including the optical workpieces 100, 200, 300, 700, 800, 900, can be or include workpieces, devices, or film stacks used as virtual reality (VR) devices, augmented reality (AR) devices, as well as other devices, including optical devices, display devices, and/or microelectronic devices.

In one or more examples, the chemical properties of deposited film are utilized to produce selectivity and pattern, instead of relying on photoresist/hard mask. In some embodiments, the mask can be a separate, removable, and/or reusable part transferring to the processing chamber with the optical workpiece and/or substrate, or incorporated as a hardware component in tool and/or processing chamber. In other embodiments, a binary mask can be a contact mask which is placed on the optical workpiece and transferred to the processing chamber together or incorporated to the processing chamber design.

Embodiments of the present disclosure further relate to any one or more of the following paragraphs 1-15:

1. A method for processing an optical workpiece, comprising: positioning a substrate containing a first layer within a processing chamber, wherein the first layer comprises grating structures separated by trenches formed in the first layer, and wherein each of the grating structures has an initial critical dimension; and depositing a second layer on at least the sidewalls of the grating structures by atomic layer deposition to produce corrected grating structures separated by the trenches, wherein each of the corrected grating structures has a corrected critical dimension greater than the initial critical dimension.

2. A method for processing an optical workpiece, comprising: applying a mask on a first layer disposed on a substrate, wherein the first layer comprises grating structures separated by trenches formed in the first layer, wherein the grating structures comprise a first group of the grating structures having a desired critical dimension and a second group of the grating structures having an initial critical dimension, wherein the desired critical dimension is greater than the initial critical dimension, and wherein the mask covers the first group of the grating structures and leaves exposed the second group of the grating structures; positioning the substrate containing the mask disposed on the first layer within a processing chamber; depositing a second layer on the second group of the grating structures by atomic layer deposition to produce corrected grating structures separated by the trenches, wherein the corrected grating structures have a corrected critical dimension greater than the initial critical dimension; and removing the mask from the first layer, wherein the first group of the grating structures and the corrected grating structures are exposed.

3. A method for processing an optical workpiece, comprising: positioning a substrate containing a first layer having a first refractive index within a processing chamber, wherein the first layer comprises grating structures separated by trenches formed in the first layer, and wherein the first layer comprises amorphous silicon, silicon nitride, silicon oxide, silicon oxynitride, silicon oxycarbide, titanium oxide, niobium oxide, dopants thereof, or any combination thereof; and depositing a second layer having a second refractive index by atomic layer deposition to completely fill the trenches and cover the grating structures, wherein the second layer comprises amorphous silicon, silicon nitride, silicon oxide, silicon oxynitride, titanium oxide, niobium oxide, aluminum oxide, dopants thereof, or any combination thereof, and wherein a difference between the first refractive index and the second refractive index is about +/−0.001 to about +/−0.1.

4. The method according to any one of paragraphs 1-3, wherein an average thickness of the corrected grating structures is about 5% to about 200% greater than an average thickness of the grating structures.

5. The method according to any one of paragraphs 1-4, wherein the corrected grating structures have an average thickness of about 50 nm to about 400 nm.

6. The method according to any one of paragraphs 1-5, wherein the corrected critical dimension of the corrected grating structures is +/−10% of the desired critical dimension of the first group of the grating structures.

7. The method according to any one of paragraphs 1-6, wherein the first layer has a first refractive index, the second layer has a second refractive index, and a difference between the first refractive index and the second refractive index is about +/−0.001 to about +/−0.1.

8. The method according to any one of paragraphs 1-7, wherein each of the first refractive index and the second refractive index is independently about 1.05 to about 4.50.

9. The method according to any one of paragraphs 1-8, further comprising depositing the second layer on the top surfaces of the grating structures by the atomic layer deposition while depositing the second layer on the sidewalls.

10. The method according to any one of paragraphs 1-9, wherein the second layer has a thickness of about 5 nm to about 100 nm.

11. The method according to any one of paragraphs 1-10, wherein the trenches are positioned at an angle of about 15° to about 75° with respect to the top surface of the first layer.

12. The method according to any one of paragraphs 1-11, further comprising applying a mask on the first layer prior to depositing the second layer, wherein the mask covers a first portion of the first layer and leaves exposed a second portion of the first layer, and wherein the grating structures are located in the second portion; depositing the second layer on the second portion of the first layer; and removing the mask from the first portion of the first layer, wherein the first portion of the first layer is exposed and the second portion of the first layer contains the second layer deposited thereon.

13. The method according to any one of paragraphs 1-12, wherein the first layer comprises amorphous silicon, silicon nitride, silicon oxide, silicon oxynitride, silicon oxycarbide, titanium oxide, niobium oxide, dopants thereof, or any combination thereof.

14. The method according to any one of paragraphs 1-13, wherein the second layer comprises amorphous silicon, silicon nitride, silicon oxide, silicon oxynitride, titanium oxide, niobium oxide, aluminum oxide, dopants thereof, or any combination thereof.

15. An optical workpiece produced, manufactured, or otherwise formed by the method according to any one of paragraphs 1-14.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise, whenever a composition, an element, or a group of elements is preceded with the transitional phrase "comprising", it is understood that the same composition or group of elements with transitional phrases "consisting essentially of", "consisting of", "selected from the group consisting of", or "is" preceding the recitation of the composition, element, or elements and vice versa, are contemplated. As used herein, the term "about" refers to a +/−10% variation from the nominal value. It is to be understood that such a variation can be included in any value provided herein.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method for processing an optical workpiece, comprising:
    positioning a substrate containing a first layer within a processing chamber, wherein the first layer comprises grating structures separated by trenches formed in the first layer, wherein the grating structures comprise a first group of the grating structures having a desired critical dimension and a second group of the grating structures having an initial critical dimension, and wherein the desired critical dimension is greater than the initial critical dimension;
    applying a mask on the first layer, wherein the mask covers the first group of the grating structures and leaves exposed the second group of the grating structures; and
    depositing a second layer on the mask and at least the sidewalls of the second group of the grating structures by atomic layer deposition to produce corrected grating structures separated by the trenches in the second group, wherein each of the corrected grating structures has a corrected critical dimension greater than the initial critical dimension.

2. The method of claim 1, wherein an average thickness of the corrected grating structures is about 5% to about 200% greater than an average thickness of the grating structures.

3. The method of claim 1, wherein the corrected grating structures have an average thickness of about 50 nm to about 400 nm.

4. The method of claim 1, wherein the first layer has a first refractive index, the second layer has a second refractive index, and a difference between the first refractive index and the second refractive index is about +/−0.001 to about +/−0.1.

5. The method of claim 4, wherein each of the first refractive index and the second refractive index is independently about 1.05 to about 4.50.

6. The method of claim 1, further comprising depositing the second layer on the top surfaces of the grating structures by the atomic layer deposition while depositing the second layer on the sidewalls.

7. The method of claim 6, wherein the second layer has a thickness of about 5 nm to about 100 nm.

8. The method of claim 1, wherein the trenches are positioned at an angle of about 15° to about 75° with respect to the top surface of the first layer.

9. The method of claim 1, further comprising
removing the second layer deposited on the mask and removing the mask from the first layer, wherein the first group of the grating structures is exposed and the second group of the grating structures contains the second layer deposited thereon.

10. The method of claim 1, wherein the first layer comprises amorphous silicon, silicon nitride, silicon oxide, silicon oxynitride, silicon oxycarbide, titanium oxide, niobium oxide, dopants thereof, or any combination thereof.

11. The method of claim 10, wherein the second layer comprises amorphous silicon, silicon nitride, silicon oxide, silicon oxynitride, titanium oxide, niobium oxide, aluminum oxide, dopants thereof, or any combination thereof.

12. A method for processing an optical workpiece, comprising:
applying a mask on a first layer disposed on a substrate, wherein the first layer comprises grating structures separated by trenches formed in the first layer, wherein the grating structures comprise a first group of the grating structures having a desired critical dimension and a second group of the grating structures having an initial critical dimension, wherein the desired critical dimension is greater than the initial critical dimension, and wherein the mask covers the first group of the grating structures and leaves exposed the second group of the grating structures;
positioning the substrate containing the mask disposed on the first layer within a processing chamber;
depositing a second layer on the mask and the second group of the grating structures by atomic layer deposition to produce corrected grating structures separated by the trenches, wherein the corrected grating structures have a corrected critical dimension greater than the initial critical dimension; and
removing the second layer deposited on the mask and removing the mask from the first layer, wherein the first group of the grating structures and the corrected grating structures are exposed.

13. The method of claim 12, wherein the corrected critical dimension of the corrected grating structures is +/−10% of the desired critical dimension of the first group of the grating structures.

14. The method of claim 12, wherein an average thickness of the corrected grating structures is about 5% to about 200% greater than an average thickness of the grating structures of the second group.

15. The method of claim 12, wherein the corrected grating structures have an average thickness of about 50 nm to about 400 nm.

16. The method of claim 12, wherein the first layer has a first refractive index, the second layer has a second refractive index, and a difference between the first refractive index and the second refractive index is about +/−0.001 to about +/−0.1.

17. The method of claim 16, wherein each of the first refractive index and the second refractive index is independently about 1.05 to about 4.50.

18. The method of claim 12, wherein the trenches are positioned at an angle of about 15° to about 75° with respect to the top surface of the first layer.

19. The method of claim 12, wherein the first layer comprises amorphous silicon, silicon nitride, silicon oxide, silicon oxynitride, silicon oxycarbide, titanium oxide, niobium oxide, dopants thereof, or any combination thereof, and wherein the second layer comprises amorphous silicon, silicon nitride, silicon oxide, silicon oxynitride, titanium oxide, niobium oxide, aluminum oxide, dopants thereof, or any combination thereof.

20. A method for processing an optical workpiece, comprising:
positioning a substrate containing a first layer having a first refractive index within a processing chamber, wherein the first layer comprises grating structures separated by trenches formed in the first layer, wherein the grating structures comprise a first group of the grating structures having a desired critical dimension and a second group of the grating structures having an initial critical dimension, wherein the desired critical dimension is greater than the initial critical dimension, and wherein the first layer comprises amorphous silicon, silicon nitride, silicon oxide, silicon oxynitride, silicon oxycarbide, titanium oxide, niobium oxide, dopants thereof, or any combination thereof;
applying a mask on the first layer, wherein the mask covers the first group of the grating structures and leaves exposed the second group of the grating structures;
depositing a second layer having a second refractive index by atomic layer deposition, wherein the second layer is deposited on the mask and to completely fill the trenches of the second group and cover the grating structures of the second group, wherein the second layer comprises amorphous silicon, silicon nitride, silicon oxide, silicon oxynitride, titanium oxide, niobium oxide, aluminum oxide, dopants thereof, or any combination thereof, and wherein a difference between the first refractive index and the second refractive index is about +/−0.001 to about +1-0.1; and
removing the second layer deposited on the mask and removing the mask from the first layer, wherein the first group of the grating structures is exposed and the second group of the grating structures contains the second layer deposited thereon.

* * * * *